United States Patent
Stephan et al.

(10) Patent No.: US 11,061,325 B2
(45) Date of Patent: Jul. 13, 2021

(54) PHOTOSENSITIVE COMPOSITION THAT CAN BE ACTIVATED BY MULTIPHOTON ABSORPTION FOR THREE-DIMENSIONAL FABRICATION

(71) Applicant: UNIVERSITE GRENOBLE ALPES, Saint Martin d' Heres (FR)

(72) Inventors: Olivier Stephan, Grenoble (FR); Laetitia Gredy, Tullins (FR)

(73) Assignee: UNIVERSITE GRENOBLE ALPES, Saint Martin d'Heres (FR)

( * ) Notice: Subject to any disclaimer, the term of this patent is extended or adjusted under 35 U.S.C. 154(b) by 17 days.

(21) Appl. No.: 16/090,231

(22) PCT Filed: Mar. 29, 2017

(86) PCT No.: PCT/FR2017/050719
§ 371 (c)(1),
(2) Date: Sep. 29, 2018

(87) PCT Pub. No.: WO2017/168093
PCT Pub. Date: Oct. 5, 2017

(65) Prior Publication Data
US 2019/0113841 A1 Apr. 18, 2019

(30) Foreign Application Priority Data
Mar. 30, 2016 (FR) ...................... 1652751

(51) Int. Cl.
*G03F 7/00* (2006.01)
*G03F 7/037* (2006.01)
(Continued)

(52) U.S. Cl.
CPC .......... *G03F 7/0037* (2013.01); *B29C 64/124* (2017.08); *B29C 64/135* (2017.08);
(Continued)

(58) Field of Classification Search
CPC ...... G03F 7/0037; G03F 7/085; G03F 7/0045; G03F 7/0387; B29C 64/135; B29C 64/124; B33Y 70/00; B33Y 80/00
See application file for complete search history.

(56) References Cited

U.S. PATENT DOCUMENTS

2006/0083890 A1  4/2006  Takizawa
2011/0190813 A1* 8/2011  Brownlee ............... A61L 27/50
                                             606/214
2013/0203146 A1* 8/2013  Ying ...................... A61L 27/54
                                             435/177

FOREIGN PATENT DOCUMENTS

DE  102009042037  3/2011
EP       0387975  3/1990
(Continued)

OTHER PUBLICATIONS

Sando et al., "Photochemically crosslinked matrices of gelatin and fibrogen promote rapid cell proliferation" J. Tissue Eng,. Regen. Med., vol. 5 pp 337-346 (2011).*
(Continued)

*Primary Examiner* — Martin J Angebranndt
(74) *Attorney, Agent, or Firm* — Hauptman Ham, LLP

(57) ABSTRACT

A photosensitive composition activatable by multiphoton absorption usable for the fabrication of a three-dimensional structure which is biodegradable and/or biocompatible and/or bioresorbable. This structure is usable as a matrix for cell culture. The photosensitive composition comprises: gelatin, collagen, a water-soluble photoinitiator, able to be excited by several photons and capable of generating singlet oxygen, optionally a cell adhesion promoter, and water. A process for preparing the photosensitive composition, a process for preparing a three-dimensional structure from the photosensitive composition, the three-dimensional structure
(Continued)

obtained by this preparation process and a matrix for cell culture comprising this structure.

19 Claims, 3 Drawing Sheets

(51) Int. Cl.
    *G03F 7/085*     (2006.01)
    *B33Y 80/00*     (2015.01)
    *B29C 64/135*     (2017.01)
    *B29C 64/124*     (2017.01)
    *B33Y 70/00*     (2020.01)
    *G03F 7/004*     (2006.01)
    *G03F 7/038*     (2006.01)

(52) U.S. Cl.
    CPC ............ *B33Y 70/00* (2014.12); *G03F 7/0045* (2013.01); *G03F 7/0387* (2013.01); *G03F 7/085* (2013.01); *B33Y 80/00* (2014.12)

(56) References Cited

FOREIGN PATENT DOCUMENTS

| | | |
|---|---|---|
| JP | 3-266980 | 11/1991 |
| JP | H11-47258 | 2/1999 |
| JP | 2004-321065 | 11/2004 |
| JP | 2006-343492 | 12/2006 |
| JP | 2013-67088 | 4/2013 |
| WO | 2012018304 | 2/2012 |
| WO | 2012041522 | 4/2012 |

OTHER PUBLICATIONS

Ibusuki et al. "Photochemically cross-linked collagen gels as three-dimensional scaffolds for tissue engineering", Tiss. Eng., vol. 13(8) pp. 1995-2001 (2007).*
Davidenko et al., "Control of crosslinking for tailoring collagen based scaffolds stability and mechanics", Acta Biomater. vol. 25 pp 131-142 (2015).*
Gautam et al., "Surface modification of nanofibrous polycaprolactone/gelatin composite scaffold by collagen type I grafting for skin tissue engineering" Mat. Sci. Eng. C, vol. C34 pp. 402-409 (2014).*
Kuetemeyeretal., "Two-photon induced collagen cross-linking in bioartifical cardiac tissue", Opt. Expr., vol. 19(17 pp. 15996-16007 (Aug. 2011).*
Bell et al., "Multiphoton crosslinking for biocompatible 3D printing of type I collagen", Biofab., vol. 7 paper 035007 (11 pages) (2015).*
Iwai et al. "Tris(1,10-phenanthroline)ruthenium(II)-and tris(2,2-bipyrazine)ruthenium(II) sensitized photopolymerization of acrylamide" Polymer J. Vol 23(6) pp. 757-763 (1991).*
Chen et al., "Light-controlled radical polymerization: mechanisms, methods, and applications" Chem. Rev., vol. 116 pp 10167-10211 (Mar. 15, 2016).*
Takemoto et al. "Preparation of collagen/gelatin sponge scaffold for sustained release of bFGF", Tissue Eng. Pt A, vol. 14(10) pp. 1629-1638 (2008).*
Ratanvaraporn et al., "Comparison of gelatin and collagen scaffolds for fibroblast cell culture", J. Metals, materials and minerals, vol. 16(1) pp. 31-36 (2006).*
Fancy et al., "Chemistry for the analysis of protein-protein interactions" Rapid and efficient cross-linking triggered by long wavelength light, Proc. Natl. Acad. Sci., USA vol. 96 pp. 6020-6024 (May 1999).*
International search report dated Aug. 1, 2017 from corresponding application No. PCT/FR2017/050719.
Office Action dated Jan. 4, 2021 from corresponding application No. JP 2018-551933; pp. 1-4.

* cited by examiner

PHOTOSENSITIVE COMPOSITION THAT CAN BE ACTIVATED BY MULTIPHOTON ABSORPTION FOR THREE-DIMENSIONAL FABRICATION

RELATED APPLICATIONS

The present application is a National Phase of International Application Number PCT/FR2017/050719, filed Mar. 29, 2017, and claims the priority of France Application No. 1652751, filed Mar. 30, 2016.

FIELD OF THE INVENTION

The field of this invention is that of the fabrication of three-dimensional structures by multiphoton absorption.

In particular, the present invention relates to a photosensitive composition for three-dimensional fabrication, the three-dimensional structures obtained from this composition and a fabrication process using multiphoton absorption as an activation process.

TECHNOLOGICAL BACKGROUND

In biology, the fabrication of three-dimensional structures is particularly used in the field of tissue engineering.

Tissue engineering consists, for example, of creating functional tissue substitutes, such as skin, cartilage or bone, which can then be in vivo implanted. These functional tissue substitutes are matrices (or porous three-dimensional supports) which have been colonised by cells. These matrices must therefore have suitable dimensions and properties to both enable the growth of cells, and be able to be subsequently in vivo implanted. In particular, these matrices must be non-toxic and preferably biocompatible, biodegradable or bioresorbable.

Numerous techniques, like for example electrospinning, can be used to produce such matrices. However, these techniques generally do not enable to have a controlled and reproducible architecture and/or with a good fabrication resolution, which is sometimes necessary for the applications sought.

To overcome these problems, multiphoton absorption has been applied to the three-dimensional fabrication of such matrices. This technique consists of focusing a light source (generally a laser) on a photosensitive material by using an adapted focusing optic. This induces a photochemical reaction (generally a polymerisation or cross-linking reaction), there where multiphoton absorption is effective, in other words, only at the focal point of the light source, there where the intensity of the light source is at a maximum (non-linear absorption event). Thus, by using computer-assisted design software and by moving the photosensitive material along the 3 axes x, y and z, it is possible to fabricate a three-dimensional structure having a controlled, reproducible architecture, and with a good resolution. The fabrication of three-dimensional structures by multiphoton absorption is, for example, defined in the chapter, "Tri-dimensional microstructuration of materials by two-photon induced photochemistry" by P. L. Baldeck, O. Stéphan and C. Andraud published in the book, "Basics and applications of photopolymerization reaction (vol 3)" by J. P. Fouassier, X. Allonas Editors, (2010) Research Signpost (chapter 14, pages 199-220).

Different photosensitive materials can be used to produce three-dimensional structures by multiphoton absorption. These are, for example, organic-inorganic hybrid resins or acrylate-based resins.

Ormocer® materials are organic-inorganic hybrid resins containing silica nanoparticles. These resins are particularly useful for producing bone tissue substitutes, as they are particularly rigid and biocompatible. However, for certain applications, it can prove to be useful to be able to modulate the rigidity of the matrix, which is not the case with this type of resin.

Acrylate-based resins are defined in numerous documents:

Document WO2015/084735 A2 defines a composition and a process for producing three-dimensional structures by two-photon absorption. The composition is a photosensitive liquid composition comprising a compound that can be polymerised radically and a photoinitiator. The compounds that can be polymerised radically comprises a methacrylate group.

Document US2012/0098164 defines a photosensitive composition comprising different methacrylates and a photoinitiator. This composition is used for the fabrication of structures having an excellent resolution (a few µm, even a few hundred nm) by two-photon absorption.

Document US2013/0012612 defines a process for producing biocompatible three-dimensional structures by two-photon absorption. The material used comprises at least one compound having both a polymerisable organic group and a biocompatible, biodegradable or bioresorbable group, such as a peptide, for example collagen. The biocompatible group cannot be used as such, it is necessary to chemically modify it by grafting a polymerisable organic group into it. The polymerisable organic group is preferably a methacrylate or acrylate group.

The rigidity of structures with a base of these methacrylate or acrylate resins is modular, and it is smaller than those of the 3D structures obtained from Ormocer® polymers. However, doubts arise regarding the biocompatibility of structures comprising acrylate or methacrylate groups. Yet, as seen above, the use as a matrix for the cell culture of these structures in the scope of tissue engineering, and because of this, the in vivo implantation of these structures, requires an increased biocompatibility.

Aims

In this context, the present invention aims to satisfy at least one of the following aims.

One of the main aims of the invention is the provision of a photosensitive composition which can be used to produce a three-dimensional structure by using multiphoton absorption as an activation process.

One of the main aims of the invention is the provision of a photosensitive composition which can be used to produce a three-dimensional structure which is biodegradable and/or biocompatible and/or bioresorbable.

Another main aim of the invention is the provision of a photosensitive composition which can be used to produce a three-dimensional structure having an excellent resolution, for example having a line width of between 1 and 5 µm (micrometres).

Another main aim of the invention is the provision of a photosensitive composition which is presented in the form of a gel at room temperature.

Another main aim of the invention is the provision of a photosensitive composition which can be used to produce a three-dimensional structure which has a controlled rigidity.

Another main aim of the invention is the provision of a photosensitive composition which can be used to produce a three-dimensional structure which is self-supported.

Another main aim of the invention is the provision of a photosensitive composition which can be used to produce a three-dimensional structure which can be used as a matrix for cell culture.

Another main aim of the invention is the provision of a three-dimensional structure obtained from a photosensitive composition having all or some of the characteristics defined above.

BRIEF DESCRIPTION OF THE INVENTION

These aims, among others, are achieved by the invention which relates to, firstly, a photosensitive composition which can be used to produce three-dimensional structures by using multiphoton absorption as an activation process. This composition comprises gelatin, collagen, a water-soluble photoinitiator, able to be excited by several photons and generate singlet oxygen from water and optionally a cell adhesion promoter such as fibronectin.

The invention also relates to a three-dimensional structure fabricated with this photosensitive composition and a process for fabricating such a three-dimensional structure.

Surprisingly, it has been discovered that such a composition would enable to fabricate three-dimensional structures having an excellent resolution (line width between 1 and 5 μm). The presence of a photoinitiator capable of generating singlet oxygen, enables the cross-linking of the proteins contained in the composition, by using multiphoton absorption as an activation process. The photochemical reaction induced by the photoinitiator being a cross-linking reaction and not a polymerisation reaction, because of this, it is not necessary to chemically modify the compounds by grafting a polymerisable group into them, they can be used as such.

With gelatin and collagen being elements coming from biomass, the composition is biocompatible. Moreover, the gelatin/collagen association enables to produce structures which have good mechanical properties and adding a cell adhesion promoter such as fibronectin improves the affinity of the cells for three-dimensional structures.

Throughout the present description, "between Z1 and Z2" means that the limits Z1 and Z2 are included in the interval [Z1, Z2].

DETAILED DESCRIPTION OF THE INVENTION

Figure 1:
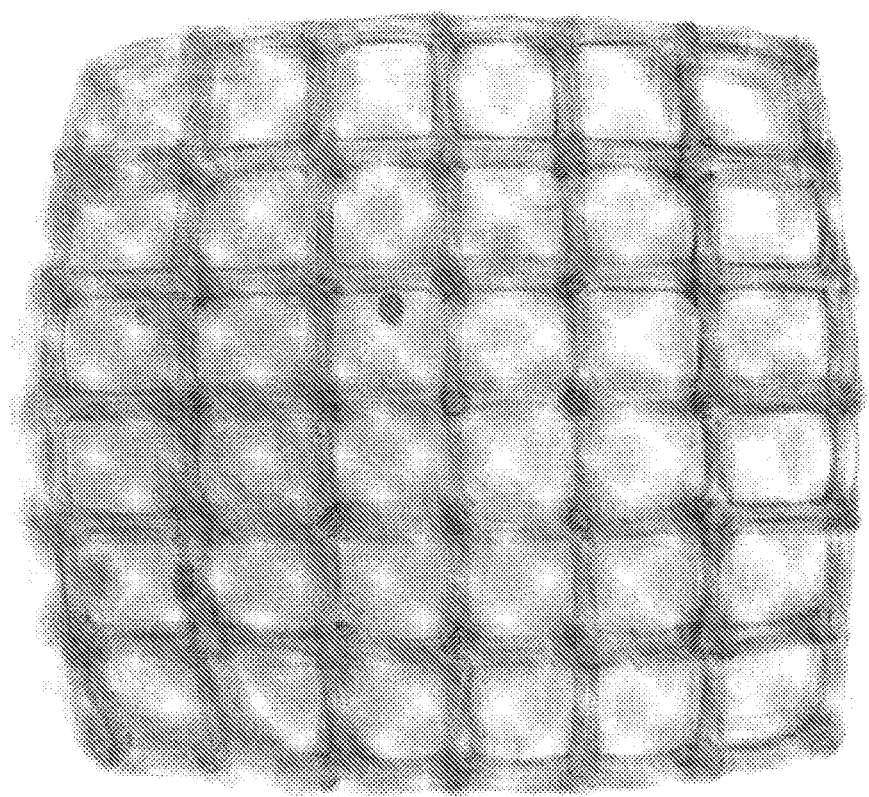
FIG. 1 represents an image under the microscope of a "chicken coop" type structure, fabricated according to example 3.

The invention therefore relates to a photosensitive composition that can be activated by multiphoton absorption which can be used to produce three-dimensional structures. This composition comprises:
  gelatin,
  collagen,
  a water-soluble photoinitiator, able to be excited by several photons and capable of generating singlet oxygen,
  optionally a cell adhesion promoter,
  and water.

By "photosensitive composition", this means, for example, a mixture sensitive to light radiation.

By "multiphoton absorption", this means, simultaneous absorption of two or more photons by a molecule in a given state, this molecule thus passing to an electronic state of greater energy. This excitation will induce a photochemical reaction at the focal point of the light source. In the case of the photosensitive composition defined above, it is the photoinitiator which simultaneously absorbs two photons, which will induce the cross-linking of the proteins of the composition at the focal point of the light source. Most of the time, multiphoton absorption corresponds to a two-photon absorption.

Gelatin is a protein which has an increased glycine and proline ratio. It is obtained by partial hydrolysis of collagen, mainly from collagen contained in the skin and bones of animals. It can be of type A (it thus comes from treatment with collagen acid), or type B (it thus comes from a basic collagen treatment). It can also be obtained by enzymatic collagen treatment. The gelatin used has not, preferably, been chemically modified. According to an embodiment of the invention, the gelatin used is food gelatin available in shops, or type B, it can be in the form of flakes, powder or granules.

According to an embodiment of the invention, the quantity of gelatin contained in the composition is between 10 and 50% by mass with respect to water, preferably between and 30%, and more preferably still, between 15 and 25%.

Collagen is a protein formed from three polypeptide chains disposed helicoidally. Glycine represents almost one third of the amino acids present in collagen. Collagen also contains an increased proline and hydroxyproline ratio. There are different types of collagen, for example type I or type II collagen. Type I collagen is the most common, it mainly comes from skin, bones and tendons. Type II collagen mainly comes from cartilages. The collagen used can be of any type and, preferably, has not been chemically modified. According to a preferred embodiment of the invention, the collagen used is type I collagen.

The minimum quantity of collagen in the composition is 1% by mass with respect to water. For example, the quantity of collagen used is between 1 and 5% by mass, preferably between 2 and 4%. According to an embodiment, the quantity of collagen used is equal to the maximum quantity of water-soluble collagen.

The photoinitiator is water-soluble, able to be excited with two photons and capable of generating singlet oxygen. By "water-soluble", this means, for example, water-soluble at 20° C. at a concentration of at least 1 mg/mL. For example, the photoinitiator is water-soluble at a concentration of between 1 and 100 mg/mL, or between 1 and 50 mg/mL, or again, between 1 and 10 mg/mL.

"Able to be excited by several photons" means, able to simultaneously absorb two photons or more. The photoinitiator does not absorb a photon with the wavelength of the light source used. In other words, the photoinitiator is transparent at the wavelength of the light source used.

According to an embodiment of the invention, the photoinitiator is selected from among transition metal complexes, preferably from among ruthenium (II), osmium (II), iridium (III), palladium (II), platinum (II), chrome (III) complexes and the mixtures thereof. Preferably, the photoinitiator is a ruthenium (II) complex.

The transition metal complex can comprise one or more ligands. When the complex comprises several ligands, these can be identical or different. Preferably, the ligand is selected from among bipyridines, 1,10-phenantroline, bipyrazine, diphenyl-1,10-phenantroline, diphenyl-1,10-phenantroline-4,7-disulphonate, 1,10-phenantroline-5-octadecanamide and the mixtures thereof.

Particularly preferably, the photoinitiator used is dichlorotris(1,10-phenantroline)ruthenium(II).

The photoinitiator is used in the composition with a minimum quantity of 0.5% by mass with respect to water. For example, the quantity of photoinitiator used is between 0.5 and 10% by mass with respect to water, preferably between 1 and 5% by mass. Particularly preferably, the quantity of photoinitiator used is between 1 and 2% by mass.

A cell adhesion promoter can be added to the composition. Preferably, the cell adhesion promoter added is fibronectin. In the case of fibronectin, a quantity of between 0.01 and 0.2% by mass with respect to water can be used. Particularly preferably, the quantity of fibronectin is between 0.05 and 0.15%.

The photosensitive composition can also comprise at least one active compound. By active compounds, this means, for example, a compound having a biological activity or a compound having a medical interest or a pharmaceutical compound.

Preferably, the water used is deionised water. Deionised water can be distilled water or bipermuted water. Bipermuted water is obtained, for example, by making water pass over a cation-exchange resin and an anion-exchange resin, such that it no longer contains $H^+$ and $OH^-$ ions.

The invention also relates to a process for obtaining the above-mentioned photosensitive composition. This process comprises the following main steps:
  preparing a mixture of gelatin, collagen, photoinitiator, optionally cell adhesion promoter, and water,
  heating the mixture to a temperature of between 30 and 60° C., preferably of between 40 and 50° C., until the compounds have dissolved in water,
  cooling the composition to room temperature, which leads to the formation of a gel.

The composition is presented in the form of gel at room temperature and in the form of liquid when it is heated to more than 40° C. The composition in the form of gel can be preserved for several weeks in the refrigerator. Moreover, the composition in the form of gel is particularly suitable for the production of three-dimensional structures by multiphoton absorption. Indeed, it largely limits the movement of the short cross-linking structure by the laser and thus guarantees a final, non-deformed structure, in line with the three-dimensional model.

The invention also relates to a three-dimensional structure produced with the photosensitive composition defined above. According to an embodiment of the invention, the three-dimensional structure has a size of around a few μm. According to another embodiment, the three-dimensional structure has a size of around a few mm.

According to an embodiment of the invention, the three-dimensional structure has a line width of between 0.5 and 6 μm, preferably of between 1 and 5 μm. By "line width", this means, for example, the width of the line obtained when a line is traced with the laser beam focused in the formulation. With the line width being very thin, the three-dimensional structure sought can comprise parts of which the smallest details will be of equal dimensions to the line width.

The three-dimensional structure can be preserved for several weeks in water or in a biological buffer of phosphate buffer type.

Adding collagen enables to reinforce the three-dimensional structure and give it good mechanical properties. The rigidity of the three-dimensional structure can be controlled by modifying the quantity of collagen present in the photosensitive composition.

The three-dimensional structure has no negative impact on the growth of cells. Preferably, the three-dimensional structure is biocompatible and/or biodegradable and/or bioresorbable, it can therefore be used as a matrix for cell culture. By "biocompatible", this means, for example, it does not degrade and does not interfere with the environment wherein it is used. By "biodegradable", this means, for example, it is at least partially decomposable by the environment wherein it is used. By "bioresorbable", this means, for example, it can be resorbed and metabolised by the environment wherein it is used.

The invention also relates to a matrix for cell culture which comprises a three-dimensional structure such as defined above. By "matrix for cell culture", this means, for example, a porous three-dimensional structure, which can be used to grow cells outside of the organism thereof or outside of the original environment thereof.

The invention also relates to a process for fabricating a three-dimensional structure comprising the following steps:
  sampling an aliquot of photosensitive composition defined above,
  exposing a part of the aliquot to a light source of adequate wavelength and sufficient intensity to induce cross-linking by multiphoton absorption,
  rinsing the non-cross-linked parts in water at a temperature of between 35 and 40° C.

Rinsing the non-cross-linked parts produces a swelling of the three-dimensional structure which has been fabricated. Thus, the dimensions of the structures are increased with respect to the structure initially fabricated.

According to an embodiment of the invention, the sampling of an aliquot of photosensitive composition is done as follows:
  heating the photosensitive composition to a temperature of between 30° C. and 60° C., preferably of between 40 and 50° C., for a duration of between 10 minutes and 1 hour, preferably between 15 and 45 minutes, and even more preferably, between 25 and 35 minutes,
  sampling a drop of the photosensitive composition,
  depositing on a plate, preferably a glass plate,
  cooling until a gel is obtained.

The whole light source having an adequate wavelength and a sufficient intensity to induce cross-linking by multiphoton absorption can be used. The light source must have a wavelength adapted to the photoinitiator, in other words, the photoinitiator must be able to absorb two photons or more at the wavelength of the light source. The wavelength of the light source is generally between 300 and 1500 nm. According to a preferred embodiment of the invention, the light source used is a laser. According to a preferred embodiment of the invention, the laser is a pulse laser and provides pulses of a duration less than 1 nanosecond. Preferably, the laser has a wavelength of 532, 780 or 1064 nm.

Cross-linking is induced when the part of the aliquot exposed to the light source is not dissolved by placing it in bipermuted water at a temperature of between 30 and 55° C. for a duration of between 10 minutes and 1 hour.

According to an embodiment of the invention, the fabrication of three-dimensional structures is done by using a focusing optic and a laser. Preferably, the focusing optic is a microscope, for example, an inverted microscope.

The cross-linking is localised only at the focal point of the light source, in other words, in a low volume of a sample (voxel). Thus, by using computer-assisted design software, and by moving the sample along the 3 axes x, y and z, it is possible to fabricate the three-dimensional structure that is sought. The structure thus has a controlled and reproducible architecture.

According to an embodiment of the invention, the rinsing of the non-cross-linked parts can be done by placing the sample for a duration of between 10 minutes and 1 hour, preferably of between 15 and 45 minutes, and more preferably still, of between 25 and 35 minutes, in bipermuted water at a temperature of between 30 and 55° C., preferably of between 35 and 40° C.

According to an embodiment of the invention, the laser power is between 1 and 2.5 mW, preferably between 1.5 and 2 mW, for example 1.5 mW. The exposure time is between 1 and 10 ms per voxel, which corresponds to scanning speeds of the laser beam of between 150 and 15 µm/s. Preferably, the scanning speeds are between 100 and 15 µm/s, more preferably still, between 20 and 40 µm/s.

According to an embodiment of the invention, the process comprises several exposures of one same part of the aliquot to a light source of adequate wavelength and of sufficient intensity to induce cross-linking by multiphoton absorption. Thus, it is possible to achieve several successive passages over an already-cross-linked part, for example between 2 and 10 passages or between 4 and 6. This enables to increase the cross-linking rate, which enables to limit the swelling of the structure during the rinsing step. The structure is therefore best resolved and the line width is decreased. For example, for horizontal lines, and after rinsing, the line width is close to 5 µm after the first passage. It decreases to 4.5 µm after the third passage to be situated around 4 µm after the fifth passage. Increasing the number of passages enables to obtain a best resolved structure (thinner lines), but also best cross-linked and therefore less deformed during the rinsing step.

In the case where an inverted microscope is used, the fact of having a solid composition in the form of gel enables a scanning of the laser inside the composition towards the base thereof, in other words, the structure can be formed by starting with the top of the latter. This enables to avoid risks of defocusing the laser by the already-cross-linked parts of the composition, and also limits the movement of the short cross-linking structure by the laser.

EXAMPLES

Three-dimensional structures are fabricated by using a conventional inverted microscope using a lens×100 (1.25 numerical aperture) coupled with the microfabrication kit, µFAB-3D, commercialised by Teemphotonics. The light source used is a pulse laser having a wavelength of 532 nm.

To do this, a sample of photosensitive composition is placed on a conventional microscope slide (25×25 mm and 170 µm thick) pre-treated with PlusOne Bind Silane from GE Healthcare in order to ensure the adhesion of the structures.

The line width of the lines is measured after rinsing the non-cross-linked parts.

The photosensitive composition is obtained from type B gelatin obtained from bovine skin, bought at Sigma-Aldrich, from type I collagen obtained from rat's tail, bought at Sigma-Aldrich, dichlorotris(1,10-phenantroline)ruthenium (II) as a photoinitiator, optionally fibronectin bought at Sigma-Aldrich and bipermuted water.

1) Preparation of the Photosensitive Composition

Example 1: Photosensitive Composition without Adhesion Promoter

To 10 mL of bipermuted water, 2 g of type B gelatin, 300 mg of type I collagen and 100 mg of dichlorotris(1,10-phenantroline)ruthenium(II) are added.

This mixture is stirred in a bain-marie at 40° C. until complete dissolution (around 1 hour). After returning to room temperature, the photosensitive composition is presented in the form of a solid gel.

Example 2: Photosensitive Composition with Adhesion Promoter

A photosensitive composition with adhesion promoter is obtained according to the working method defined in example 1, by adding 10 mg of fibronectin to the mixture.

2) Fabrication of the Three-Dimensional Structure

Example 3: Three-Dimensional Structure without Adhesion Promoter

An aliquot of the composition obtained according to example 1 is sampled and heated in the bain-marie to 40° C. for 30 minutes, while stirring. The photosensitive composition is then in the liquid state.

A drop of this photosensitive composition in liquid state is sampled and deposited on a microscope slide. After returning to room temperature, the composition is again in the form of gel, the sample is ready.

A "chicken coop" type structure, with a mesh of 11×11 µm is fabricated by using a laser power close to 1.9 mW, a scanning speed close to 30 µm/s, an exposure time of 5 ms and by achieving 5 successive passages of the laser over the parts to be cross-linked.

After fabrication of the three-dimensional structure, the sample is placed for 30 minutes in bipermuted water at 37° C., so as to dissolve the non-cross-linked parts.

FIG. 1 shows the structure obtained under the microscope. Following the swelling of the structure, it has a height of 100 µm and the side length of 115 µm. The line width of the horizontal lines is between 3.8 and 4.2 micrometres, the line width of the vertical lines is between 2 and 2.5 µm.

This figure shows that specific three-dimensional structures can be fabricated with this photosensitive composition.

Example 4: Three-Dimensional Structure with Adhesion Promoter

A "chicken coop" type structure, with a mesh of 15×15 µm is fabricated according to the working method defined in example 3 by using the composition obtained according to example 2.

3) Tests in Cell Culture

The structures obtained according to example 4 have been tested in cell culture. T24 type cancerous cells have been cultured for 48 hours with these structures. The culture conditions are standard conditions. After 48 hours, the cells have been fixed with a 2% paraformaldehyde solution and the nuclei have been coloured with Hoescht.

Figure 2A:
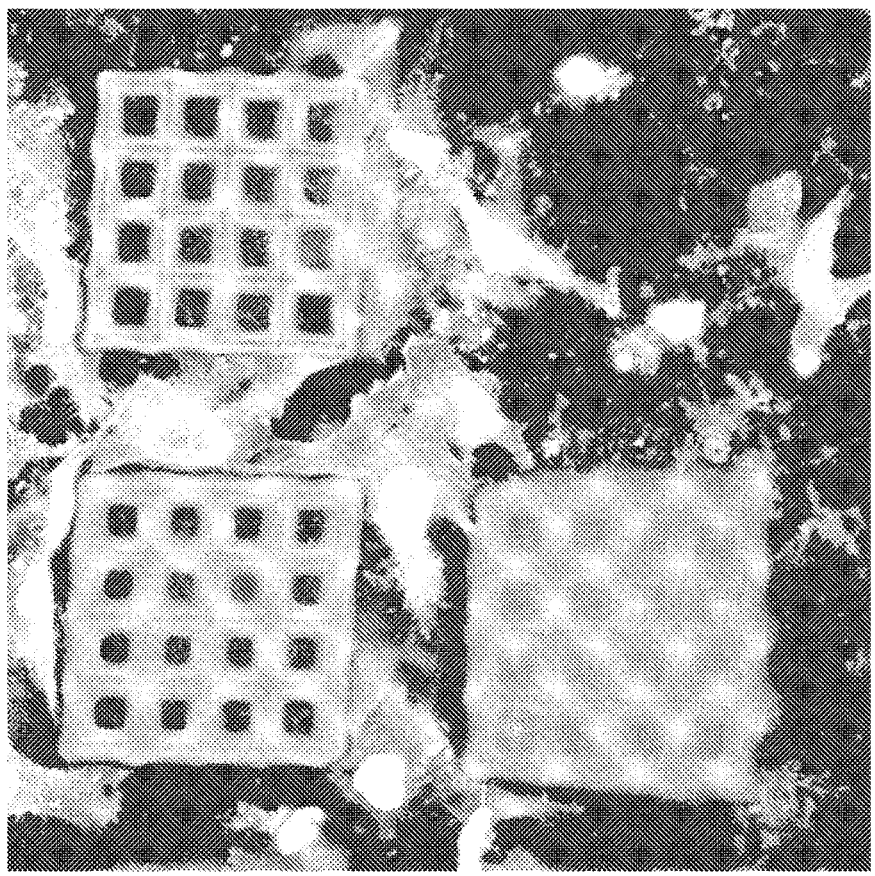
FIGS. 2A and 2B represent images under the confocal microscope of structures fabricated according to example 4 and used as a matrix for cell culture.
Figure 2B:
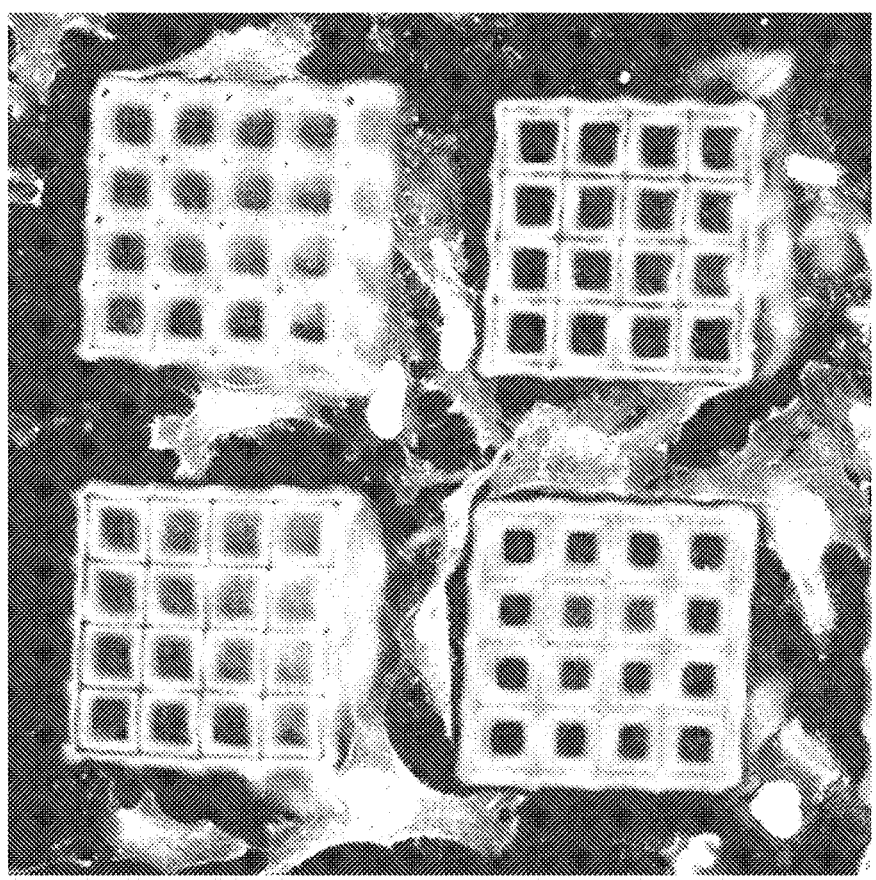

FIGS. 2A and 2B show three-dimensional structures and the cells under the confocal microscope. FIG. 2A shows three three-dimensional structures having the appearance of grids surrounded by off-white cells, and FIG. 2B shows four three-dimensional structures having the appearance of grids surrounded by off-white cells. The cells and the three-dimensional structures are clearly visible and the mortality rate of the cells after 48 hours of culture is normal. The cultured cells therefore tolerate the fabricated three-dimensional structures very well, which shows the biocompatibility of these structures.

The invention claimed is:

1. A method of producing a three-dimensional structure comprising:
preparing a photosensitive gel using the operations of
preparing a mixture of water, gelatin, collagen, and a water-soluble photoinitiator, the photoinitiator capable of generating singlet oxygen under multiphoton excitation;
maintaining the mixture at a temperature above a gel melting point of the mixture to obtain a photosensitive solution; and
cooling the photosensitive solution to a temperature below the gel melting point of the mixture to obtain a photosensitive gel;
melting a portion of the photosensitive gel;
sampling an aliquot of from the melted portion of the photosensitive gel;
applying the aliquot to a substrate;
cooling the aliquot to obtain a quantity of the photosensitive gel;
exposing a first part of the quantity of the photosensitive gel with a focused and pulsed light source to induce cross-linking by multiphoton absorption, thereby forming a three-dimensional structure comprising a cross-linked first part of the photosensitive gel within the quantity of the photosensitive gel;
rinsing the quantity of the photosensitive gel to remove a non-cross-linked second part of the quantity of the photosensitive gel by placing the quantity of the photosensitive gel in a heated water bath of sufficient volume and for a rinse period sufficient to dissolve the non-cross-linked second part of the quantity of the photosensitive gel; and
recovering the three-dimensional structure from the heated water bath.

2. The method according to claim 1, wherein the photosensitive gel comprises a quantity of gelatin of between 10 and 50% by mass with respect to water.

3. The method according to claim 2, wherein the photosensitive gel comprises a mass ratio of gelatin to collagen of between 50:1 and 2:1.

4. The method according to claim 1, wherein the photosensitive gel comprises a quantity of photoinitiator of between 0.5 and 10% by mass with respect to water.

5. The method according to claim 4, wherein the photoinitiator is a transition metal complex, selected from the group consisting of ruthenium (II), osmium (II), iridium (III), palladium (II), platinum (II), and chrome (III) complexes and mixtures thereof.

6. The method according to claim 5, wherein the photoinitiator is dichlorotris(1,10-phenanthroline)ruthenium (II).

7. The method according to claim 1, wherein the gel melting point of the mixture is at least 40° C.

8. The method according to claim 1, wherein the mixture further comprises a biologically active compound.

9. The method according to claim 8, wherein the structure comprises a matrix for culturing cells.

10. The method according to claim 1, wherein the light source is focused to form a plurality of structural elements within the first portion of the photosensitive composition, the structural elements having a line width of between 1 and 5 μm.

11. The method according to claim 1, wherein the three-dimensional structure comprises a matrix for culturing cells.

12. The method according to claim 1, wherein the light source is a laser.

13. The method according to claim 12, wherein
the laser emits light having a wavelength of 532, 780, or 1062 nm.

14. The method according to claim 12, wherein
the laser illuminates the first part of the quantity of the photosensitive gel using a plurality of pulses, each pulse having a pulse duration of less than 1 nanosecond.

15. The method according to claim 1 wherein:
the heated water bath is maintained at a temperature of at least 30° C. for the duration of the rinsing operation; and
the heated water bath comprises water that has been exposed to both a cation exchange resin and an anion exchange resin before being added to the heated water bath.

16. The method according to claim 1, wherein the mixture further comprises:
a cell adhesion promoter.

17. The method according to claim 16, wherein the three-dimensional structure comprises a matrix for culturing cells.

18. A process for preparing a three-dimensional structure comprising the following steps:
preparing a photosensitive composition comprising gelatin, collagen, a water-soluble photoinitiator capable of undergoing multiphoton excitation and generating singlet oxygen, and water;
sampling an aliquot of the photosensitive composition;
exposing a first part of the aliquot with a focused light source having a wavelength, an intensity, and an exposure duration sufficient to induce cross-linking by multiphoton absorption, thereby forming a three-dimensional structure within the aliquot; and
rinsing the aliquot to remove a non-cross-linked second part of the aliquot and thereby recovering the three-dimensional structure by placing the aliquot in a heated water bath for a rinse duration sufficient to remove the non-cross-linked second part of the aliquot.

19. A method of producing a three-dimensional structure comprising:
obtaining a photosensitive gel comprising a mixture of water, gelatin, collagen, and a water-soluble photoinitiator, the photoinitiator capable of generating singlet oxygen under multiphoton excitation;
melting a portion of the photosensitive gel;
sampling an aliquot of from the melted portion of the photosensitive gel;
applying the aliquot to a substrate;
cooling the aliquot to obtain a quantity of the photosensitive gel;
exposing a first part of the quantity of the photosensitive gel with a focused and pulsed light source to induce cross-linking by multiphoton absorption, thereby forming a three-dimensional structure comprising a cross-linked first part of the photosensitive gel within the quantity of the photosensitive gel;

rinsing the quantity of the photosensitive gel to remove a non-cross-linked second part of the quantity of the photosensitive gel by placing the quantity of the photosensitive gel in a heated water bath of sufficient volume and for a rinse period sufficient to dissolve the non-cross-linked second part of the quantity of the photosensitive gel; and recovering the three-dimensional structure from the heated water bath.

\* \* \* \* \*